United States Patent

Breems et al.

(10) Patent No.: US 10,439,633 B2
(45) Date of Patent: Oct. 8, 2019

(54) SIGMA DELTA MODULATOR, INTEGRATED CIRCUIT AND METHOD THEREFOR

(71) Applicant: NXP B.V., Eindhoven (NL)

(72) Inventors: Lucien Johannes Breems, Waalre (NL); Muhammed Bolatkale, Rijswijk (NL); Chenming Zhang, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/926,442

(22) Filed: Mar. 20, 2018

(65) Prior Publication Data

US 2018/0343013 A1  Nov. 29, 2018

(30) Foreign Application Priority Data

May 25, 2017 (EP) .................................. 17172940

(51) Int. Cl.
*H03M 3/00* (2006.01)

(52) U.S. Cl.
CPC ............. *H03M 3/322* (2013.01); *H03M 3/37* (2013.01); *H03M 3/42* (2013.01); *H03M 3/464* (2013.01); *H03M 3/496* (2013.01)

(58) Field of Classification Search
USPC ........................................................ 341/156
See application file for complete search history.

(56) References Cited

U.S. PATENT DOCUMENTS

| 6,473,019 B1* | 10/2002 | Ruha ...................... H03M 3/334 |
| | | 341/143 |
| 2004/0145504 A1* | 7/2004 | Doerrer .................. H03M 3/37 |
| | | 341/143 |
| 2016/0020781 A1 | 1/2016 | Baringer et al. | |

OTHER PUBLICATIONS

Park, CJ. et al., Efficient Broadband Current-Mode Adder-Quantizer Design for Continuous-Time Sigma-Delta Modulators, IEEE Transactions on Very Large Scale Integration (VLSI) Systems, vol. 23, No. 9, Sep. 2015 (Year: 2015).*

Paton, S. et al., A 70-mW 300-MHz CMOS Continuous-Time Sigma-Delta ADC With 15-MHz Bandwidth and 11 Bits of Resolution, IEEE Journal of Solid-State Circuits, vol. 39, No. 7, Jul. 2004 (Year: 2004).*

(Continued)

*Primary Examiner* — Howard Williams
(74) *Attorney, Agent, or Firm* — Rajeev Madnawat (57) ABSTRACT

A multi-bit continuous-time sigma-delta modulator, SDM, includes an input configured to receive an input analog signal; a first summing junction configured to subtract a feedback analog signal from the input analog signal; a loop filter configured to filter an output signal from the first summing junction: an analog-to-digital converter, ADC, configured to convert the filtered analog output signal to a digital output signal; and a feedback path for routing the digital output signal to the first summing junction. The feedback path includes a plurality of digital-to-analog converters, DACs, configured to convert the digital output signal to an analog form. The ADC includes multiple per-bit parallel loops, each loop configured to provide a per-bit current summation of the filtered analog output signal such that an output of the multiple per-bit parallel loops is a multi-bit quantization digital output signal.

10 Claims, 4 Drawing Sheets

(56) References Cited

OTHER PUBLICATIONS

European Search report and opinion from priority application EP17172940_dated Nov. 21, 2017.*

Jiang, F et al. "Beyond-one-cycle loop delay CT ΔΣ modulators with proper rational NTF synthesis and time-interleaved quantizers", IEEE 56th International Midwest Symposium on Circuits and Systems (MWSCAS), Columbus, OH, pp. 558-561 (2013).

Zhang, C. et al. "Current-mode multi-path excess loop delay compensation for GHz sampling CT ΣΔ ADCs", IEEE International Symposium on Circuits and Systems (ISCAS), Baltimore, MD, pp. 1-4 (2017).

Cherry, J.A. et al. "Excess loop delay in continuous-time Delta-Sigma modulators", IEEE Transactions on Circuits and Systems—II: Analog and Digital Signal Processing, vol. 46, No. 4, pp. 376-389 (Apr. 1999).

Bolatkale, M. et al. "A 4 GHz continuous-time ΔΣ ADC with 70 dB DR and -74 dBFS THD in 125 MHz BW", IEEE Journal of Solid-State Circuits, vol. 46, No. 12, pp. 2857-2868 (Dec. 2011).

Dong, Y. et al. "A continuous-time 0-3 MASH ADC achieving 88 dB DR With 53 MHz BW in 28 nm CMOS", IEEE Journal of Solid-State Circuits, vol. 49, No. 12, pp. 2868-2877 (Dec. 2014).

Srinivasan, V. et al. "A 20mW 61dB SNDR (60MHz BW) 1b 3rd-order continuous-time delta-sigma modulator clocked at 6GHz in 45nm CMOS", IEEE Int. Solid-State Circuits Conf. (ISSCC) Dig. Tech. Papers, pp. 158-160 (2012).

U.S. Appl. No. 15/935,045, 24 pgs, filed Mar. 25, 2018.

Notice of Allowance for U.S. Appl. No. 15/935,045, 8 pgs. (dated Jun. 26, 2019).

\* cited by examiner

SIGMA DELTA MODULATOR, INTEGRATED CIRCUIT AND METHOD THEREFOR

CROSS-REFERENCE TO RELATED APPLICATIONS

This application claims the priority under 35 U.S.C. § 119 of European Patent application no. 17172940.3, filed on May 25, 2017, the contents of which are incorporated by reference herein.

FIELD OF THE INVENTION

The field of this invention relates to a sigma-delta modulator, an integrated circuit and method therefor. In particular, the field relates to loop delay compensation for continuous-time sigma-delta ADCs with multi-bit quantization.

BACKGROUND OF THE INVENTION

Analog-to-digital converters (ADCs) with signal bandwidth (BW)>500 MHz and Signal to Noise and Distortion Ratio (SNDR)>60 dB are needed for many applications, such as: base station receivers, automotive ethernet, and next generation 5G cellular telecommunications. Sigma-Delta modulation is a method for encoding analog signals into digital signals, often used in an analog-to-digital converter (ADC) and capable of achieving these performance levels. Sigma-Delta modulation is also used to transfer high bit-count, low frequency, digital signals into lower bit-count, higher frequency, digital signals as part of the process to convert digital signals into analog (i.e. as part of a digital-to-analog converter (DAC)). Sigma-delta ADCs are over-sampling ADCs that sample the signal at much higher rates than a Nyquist rate.

In a conventional ADC, an analog signal is integrated, or sampled, with a sampling frequency and subsequently quantized in a multi-level quantizer into a digital signal. This process introduces quantization error noise. The first step in a sigma-delta modulation is delta modulation. In delta modulation the change in the signal (i.e. its 'delta') is encoded, rather than the absolute value. The result is a stream of pulses, as opposed to a stream of numbers, as is the case with pulse code modulation. In sigma-delta modulation, the accuracy of the modulation is improved by passing the digital output through a 1-bit DAC and adding (sigma) the resulting analog signal, to the input signal (the signal before delta modulation), thereby reducing the error introduced by the delta-modulation.

Discrete-time ADCs implemented using switched-capacitor circuits have been the designer's choice for the last few decades. However, recently, continuous-time sigma-delta ADCs have gained popularity in technical journals and the industry. Continuous-time sigma-delta ADCs with multi-bit quantization are popular for bandwidths (BW) larger than 100 MHz. Multi-bit quantization has the advantages of lower quantization noise, relaxed clock jitter requirement, and it allows the designers to use more aggressive noise transfer functions (NTFs). The principle of noise shaping and oversampling in continuous-time sigma-delta ADCs remains the same as its discrete-time counterpart. The key difference between a continuous-time sigma-delta ADC and a discrete time sigma-delta ADC is where the sampling operation takes place. In the continuous-time design, input sampling takes place just before the quantizer. The loop filter is now continuous-time using continuous-time integrators, often resistor-capacitor (RC) or transconductance-capacitor (gm/C) integrators.

Continuous-time sigma-delta ADCs contain one or multiple sigma-delta modulators (SDMs). A SDM is a feedback loop containing a loop filter, the quantizer, and the feedback DAC(s). The function of the quantizer is sampling and quantization. Its input signal is continuous in time domain and continuous in voltage (or current) domain, i.e. a continuous-time, continuous-value (analog signal). Its output signal should be discrete in time domain and discrete in voltage domain, i.e. discrete-time discrete-value (digital signal). The function of the main feedback DAC is a zero-order hold, which converts the digital signal to analog signal.

Excess loop delay (ELD) is a known phenomenon in continuous-time sigma-delta ADCs, as described in J. A. Cherry and W. M. Snelgrove, "Excess loop delay in continuous-time DeltaSigma modulators", IEEE Transactions on Circuits and Systems—II: Analog and Digital Signal Processing, vol. 46, no. 4, pp. 376-389, April 1999. Generally, the loop delay contains the regeneration time of the quantizer, the delay of the feedback DACs and the delay of the circuit between the quantizer and DACs. For high-speed continuous-time Sigma-Delta ADCs, the excess loop delay can be as large as one quantizer sampling clock period (1 $T_s$). The excess loop delay can deteriorate the resolution of the continuous-time sigma-delta ADCs, or even make it unstable. One known technique to compensate the excess loop delay is to add a direct feedback path through an ELD DAC around the quantizer itself, as shown in FIG. 1.

Figure 1:
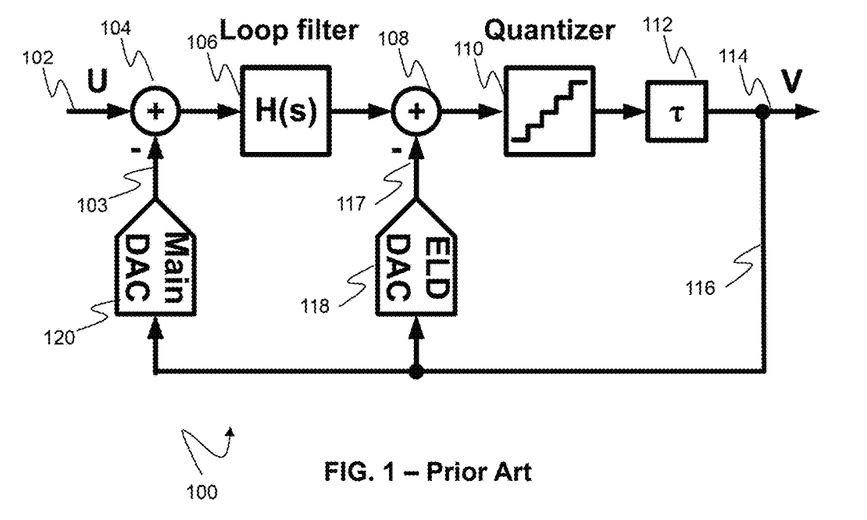
FIG. 1 illustrates a block diagram of a known continuous-time sigma-delta ADC with excess loop delay compensation.

Referring to FIG. 1, a block diagram of part of a continuous-time sigma-delta ADC 100 with quantization and ELD compensation is illustrated. The continuous-time sigma-delta ADC 100 includes an input signal 102 and whereby a main feedback signal 103 is subtracted from the input signal 102 in first summing junction 104. The resultant signal is input to a loop filter 106 and a feedback ELD compensation signal 117 subtracted therefrom in a second summing junction 108. The analog signal output from the second summing junction 108 is input to a quantizer 110, such as an ADC and input to a delay 112. The output of the delay 112 is the output 114 of the sigma-delta ADC 100. The output 114 is fed back 116 to an ELD DAC 118, to generate the ELD compensation signal 117 to be input to the second summing junction 108. The ELD compensation is typically implemented by a capacitive DAC and the capacitor of an RC integrator. The feedback 116 is also fed back to a main DAC 120 to generate an analog version of the output signal 114 to be input to first summing junction 104 and thereby form a feedback loop. Notably, an amplifier of the RC integrator is located in the fast (main) feedback loop. However, the amplifiers in the fast feedback loop have very high gain bandwidth (GBW) requirements and they are very power hungry.

Figure 2:
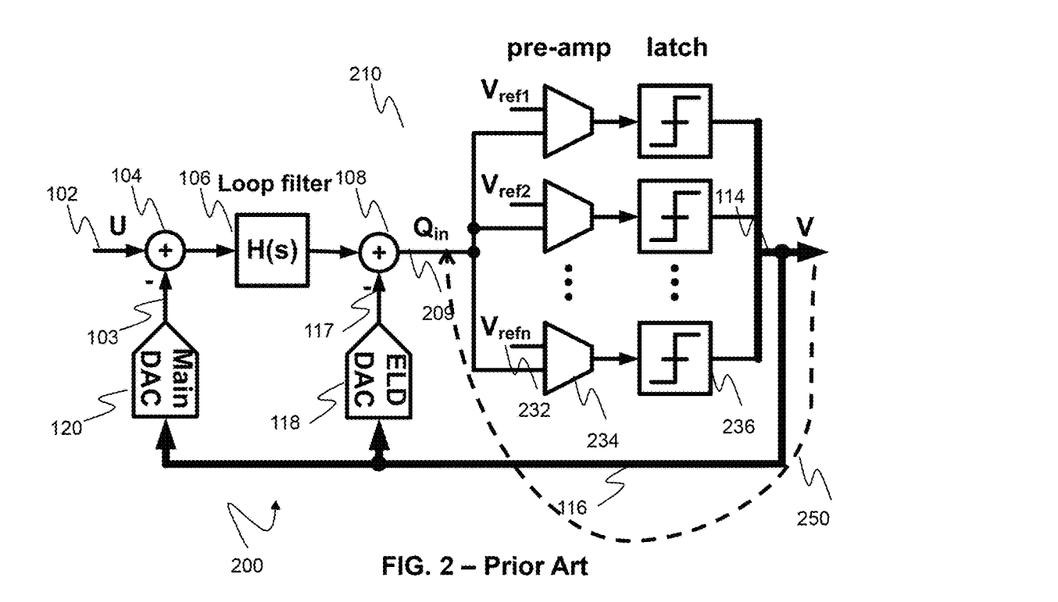
FIG. 2 illustrates a known example of a conventional SDM system architecture with multi-bit quantization and ELD compensation.

Referring now to FIG. 2, a known example of a conventional SDM system architecture 200 with multi-bit quantization and ELD compensation is illustrated. Conventionally, the ELD DAC 118 has a voltage output, and the output of the loop filter 106 is also in the voltage domain. These two voltage signals are summed in summing junction 108, sometimes with a summation amplifier, as described in M. Bolatkale, L. Breems, R. Rutten and K. Makinwa, titled 'A 4 GHz continuous-time ΔΣ ADC with 70 dB DR and −74 dBFS THD in 125 MHz BW', published in IEEE Journal of Solid-State Circuits, vol. 46, no. 12, pp. 2857-2868, December 2011, or with passive components, as described in Y.

Dong, W. Yang, R. Schreier, A. Sheikholeslami and S. Korrapati, titled 'A continuous-time 0-3 MASH ADC achieving 88 dB DR With 53 MHz BW in 28 nm CMOS', published in IEEE Journal of Solid-State Circuits, vol. 49, no. 12, pp. 2868-2877, December 2014. The resultant output 209 from the summing junction 108 is the input voltage of the quantizer, which in this figure is shown as a multi-bit comparator $Q_{in}$ 210. Here, $Q_{in}$ 209 is compared with several reference voltages $V_{ref1}$, $V_{ref2}$, . . . , $V_{refn}$ 232 in several pre-amplifiers 234. The differences between $Q_{in}$ 209 and $V_{ref1}$, $V_{ref2}$, . . . , $V_{refn}$ 232 are amplified by the gain of the pre-amplifiers 234. These amplified signals are passed to respective latches 236, and are further amplified by the positive feedback of the latches 236. The outputs of the latches are the output of the multi-bit comparator 210. These outputs are sampled and passed to the main DAC 120 and ELD DAC 118 via feedback 116.

The loop filter can be in either feed-forward (FF) or feedback (FB) structure. Only one common fast FB path 250 is used for the ELD compensation. In the architecture of FIG. 2, if the total delay of the fast feedback path 250 through the multi-bit comparator 210 and ELD DAC 118 is less than a single sampling time period $T_s$ (and the total delay of the slow feedback path through the multi-bit comparator 210 and the main DAC 120 is no more than one $T_s$), with proper parameters for the SDM, the SDM can be designed to be stable. In this scenario, a suitable resolution of the SDM can be achieved without use of the ELD loop. However, in a scenario of very high speed continuous-time Sigma-Delta ADCs, the pre-amplifiers 234 have to be optimized for less delay, which limits the gain they can offer, whilst consuming a lot of power. Also, the use of such preamplifiers 234 always creates undesirable delay.

Thus, there is a desire to reduce the effects of, or avoid, the delay introduced by such pre-amplifiers 234 in SDMs, and particularly continuous-time sigma-delta ADCs.

SUMMARY OF THE INVENTION

The present invention provides a SDM with multi-bit continuous-time quantization and ELD compensation, an integrated circuit and method therefor as described in the accompanying claims. Specific embodiments of the invention are set forth in the dependent claims. These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION

Because the illustrated embodiments of the present invention may, for the most part, be implemented using electronic components and circuits known to those skilled in the art, details will not be explained in any greater extent than that considered necessary to understand and appreciate the underlying concepts of the present invention and, in order not to obfuscate or distract from the teachings of the present invention.

In some examples, a current-mode multi-path excess loop delay compensation for continuous-time sigma-delta ADCs with multi-bit quantization technique is described that removes the need for pre-amplifiers and therefore reduces the effects of the delay of pre-amplifiers in SDMs, and particularly continuous-time sigma-delta ADCs. The proposed system provides a new ELD compensation approach based on multiple fast feedback loops operating in the current domain.

Examples of the invention propose a duplication of the summation node amongst multiple quantizer paths operating in the current domain. Respective Gm cell and ELD DACs are also duplicated. Instead of comparing the $Q_{in}$ voltage signal with reference voltage signal $V_{ref}$ in the pre-amplifiers, as in the known ELD DAC compensation circuits, a corresponding reference current signal $I_{ref}$ may be added in the same summation nodes. Reference currents are static, pre-selected currents that relate to the voltage reference in the current domain. Thus, the known use of pre-amplifiers, and inherent disadvantages that result therefrom, are removed from the system. The resulting current signal, in examples of the invention directly drives a comparator latch.

Examples of the invention provide a multi-bit sigma-delta modulator, SDM, that includes an input configured to receive an input analog signal; a first summing junction configured to subtract a feedback analog signal from the input analog signal; a loop filter configured to filter an output signal from the first summing junction: an analog-to-digital converter, ADC, configured to convert the filtered analog output signal to a digital output signal; and a feedback path for routing the digital output signal to the first summing junction. The feedback path includes a plurality of digital-to-analog converters, DACs, configured to convert the digital output signal to an analog form. The ADC includes multiple per-bit parallel loops, each loop configured to provide a per-bit current summation of the filtered analog output signal (309) such that an output of the multiple per-bit parallel loops is a multi-bit quantization digital output signal. An integrated circuit comprising a continuous-time sigma-delta ADC and a method therefor are also described. In this manner, by employing current-mode multi-path excess loop delay compensation of the respective loop filter outputs, respective ELD DAC outputs and respective current references, and by duplicating the summation nodes, the pre-amplifier is omitted and its delay prevented.

Figure 3:
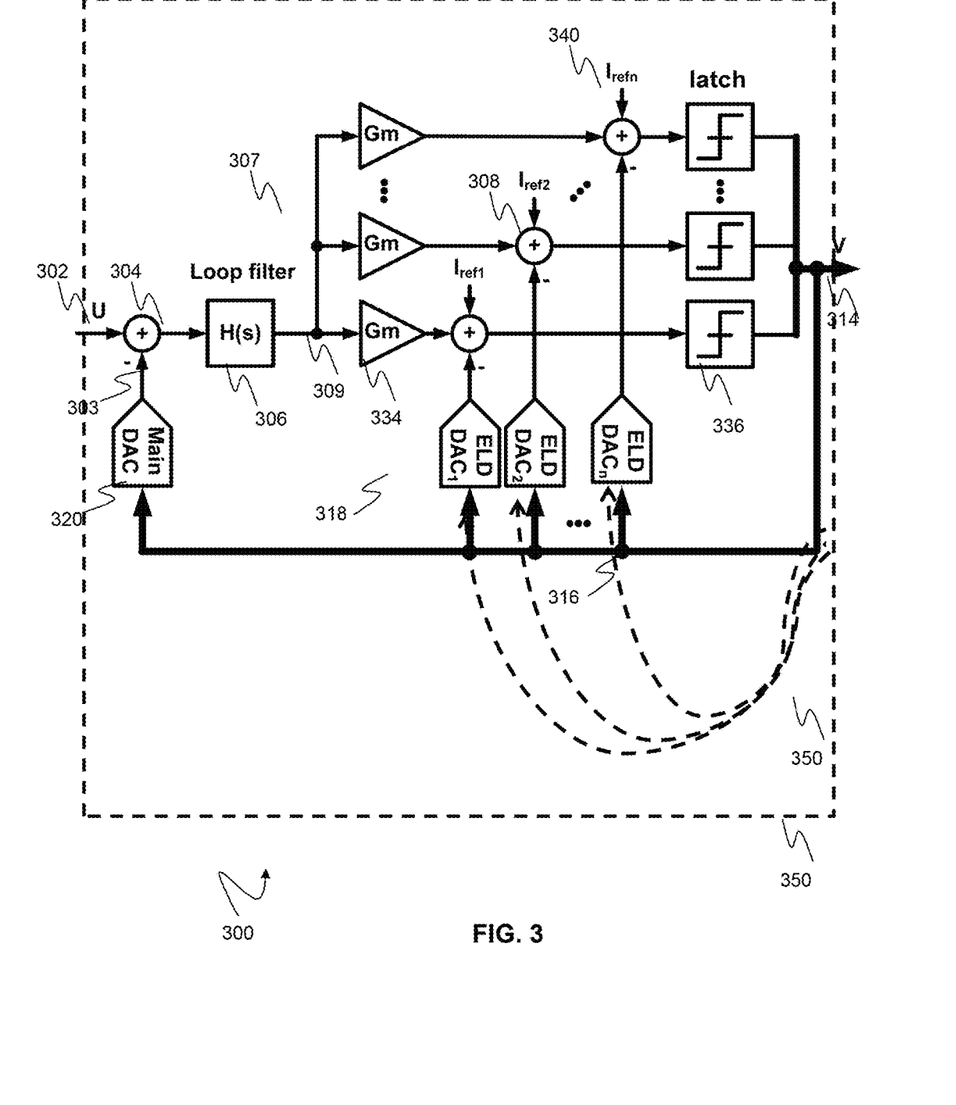
FIG. 3 illustrates an example of a SDM system architecture with multi-bit quantization and ELD compensation, according to some examples of the invention.

Referring now to FIG. 3, an example of a SDM architecture 300 with multi-bit quantization and ELD compensation, according to some examples of the invention, is illustrated. In this example, the SDM architecture 300 includes an input signal 302 whereby a feedback signal 303 is subtracted from the input signal 302 in first summing junction 304. The resultant signal is input to a loop filter 306. The output from the loop filter 306 is input to a series of parallel quantizer paths 307. The number of paths equates to the number of bits of the ADC, with each path equating to the creation of 1-bit.

Each quantizer path 307 includes a transconductance amplifier (Gm) 334 to respectively convert the loop filter's output voltage signal to a current signal. In other examples, any passive or active circuit or component can be used to convert the voltage to current, such as a resistor. Each transconductance amplifier 334 amplifies the filter signal and inputs the amplified signal to a respective second summing junction 308 (on each quantizer path) and a feedback ELD signal subtracted therefrom in respective second summing junctions 308 and a reference current 340 added there to. The analog signals that are output from each of the second summing junctions 308 are input to respective latches 336. The output of each of the latches 336 provides the multi-bit output 314 of the sigma-delta ADC 300. The multi-bit (illustrated as thick lines) digital signal output 314 is fed back 316 to a set of parallel ELD DACs 318, one per quantizer path 307, in order to generate a respective ELD compensation signals to be input to the respective second summing junctions 308. In this example, the ELD DACs 318 are designed to be current-steering DACs, which have current output. Several reference current signals 340 ($I_{ref1}$, $I_{ref2}$, ..., $I_{refn}$) are needed and are respectively input to second summing junctions 308. In some examples, dependent upon the transfer function being employed, equally spaced reference currents may be used.

In this manner, the loop filter output signal 309 (once converted to current), output current signals from the ELD DACs 318 and each reference current signal 340 are summed in the current domain with their own corresponding summation node 308. Thus, the summation nodes are duplicated. The resulting current signals directly drive 'n' latches 336. The outputs of the latches are the output of the multi-bit comparator. Thus, in the proposed SDM system 300, with (n+1)-level quantization, 'n' Gm cells 334 and 'n' ELD DACs 318 are required, where every ELD DAC 318 is a (n+1)-level DAC. However, and advantageously in this case, the pre-amplifiers employed in known SDM systems with multi-bit quantization are no longer needed. Thus, the delay that had been previously introduced by these known pre-amplifiers is no longer a problem.

Generally speaking, the function of the latch has three phases: (i) acquiring the initial condition, (ii) regeneration, and (iii) reset. In the conventional system architecture 200 in FIG. 2, or indeed one example of the proposed system 300 in FIG. 3, the latches have to finish all three phases within one sampling clock period $T_s$. In the scenario of very high speed continuous-time Sigma-Delta ADCs, it is preferable to maximize the regeneration time of the latches. Thus, it often requires using very strong reset switches in order to minimize the reset time, which adds load on the output node of the latch.

In some examples, the SDM and the components or circuits therein, may be implemented in an integrated circuit 360. In other examples, as illustrated in FIG. 4, the SDM and the components or circuits therein may be implemented as a plurality of sliced quantization paths.

Additionally, in the prior art system illustrated in FIG. 2, the summation output ($Q_{in}$) of summing junction 108 needs to drive multiple pre-amplifiers 234. This implies that a large parasitic capacitance is on the node $Q_{in}$, which generates a pole and adds delay in the fast feedback loop. In contrast, in the system illustrated in FIG. 3, the loop filter 306 output drives multiple Gm cells 334. The parasitic capacitance on the loop filter 308 output node also generates a pole, but this pole is advantageously located outside of the multiple fast feedback loops 350. Generally, the outer feedback loop is less sensitive to the extra delay than the fast feedback loops 350. For completeness, the feedback 316 is also fed back to a main DAC 320 to generate an analog version of the output signal 314 in first summing junction 304 and thereby form a feedback loop.

Figure 4:
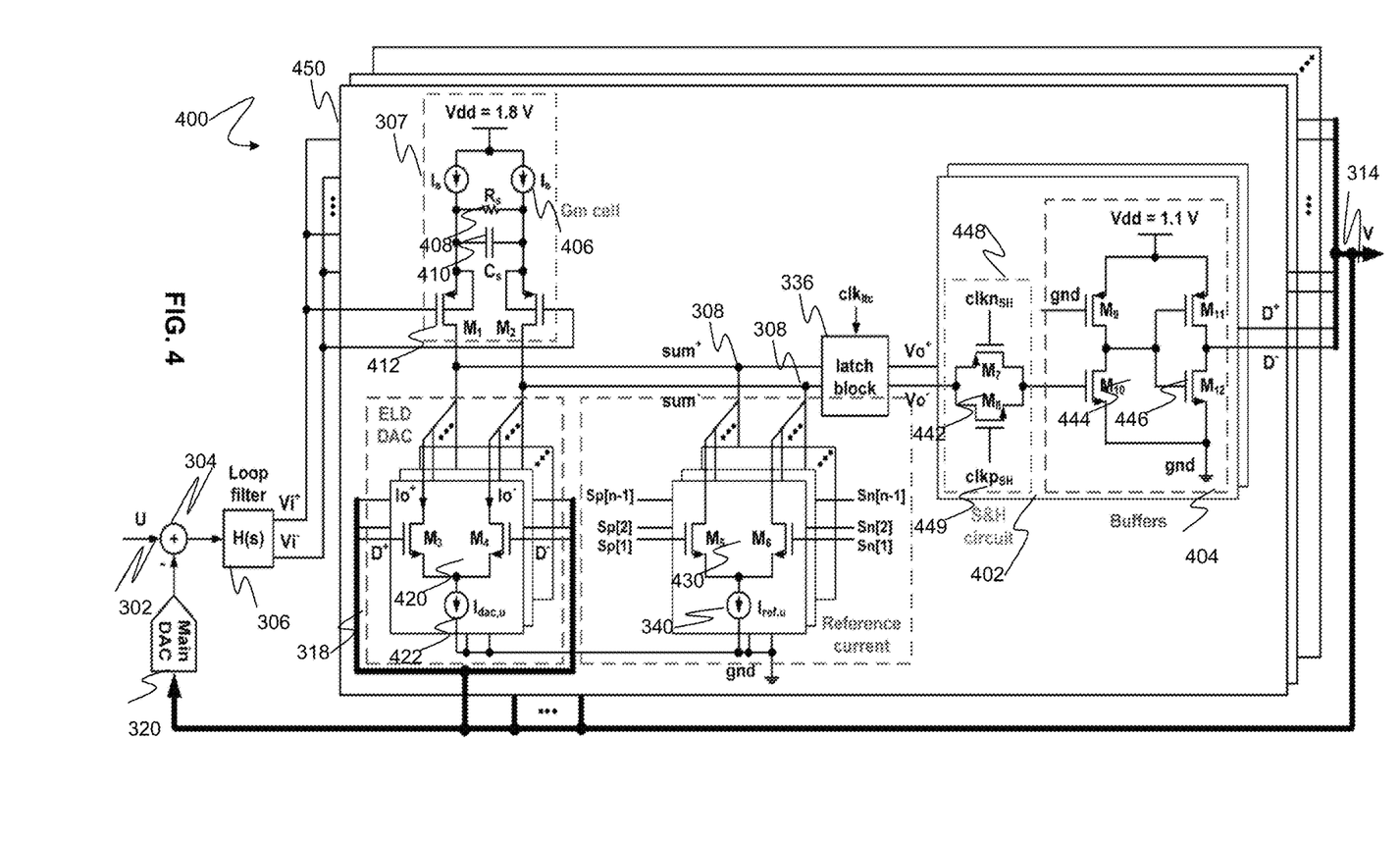
FIG. 4 illustrates an example circuit schematic of a SDM with multi-bit quantization and ELD compensation, according to some examples of the invention.

Referring now to FIG. 4, an example transistor-level implementation 400 of the proposed current-mode multi-path ELD compensation in a sliced multi-bit SDM, is illustrated according to some examples of the invention. In the example transistor-level implementation 400, a Gm cell, an ELD DAC 318, an associated reference current 340, a latch 336, the S&H circuit 402 and buffers 404 compose a slice of the ELD-compensated quantizer. The transistor-level circuit implementation of the proposed SDM system shows the $m^{th}$ slice of the duplicated summation node and 1-bit comparator in detail. Here we assume the SDM uses (n+1)-level quantization. So the SDM has totally n slices of duplicated summation node and 1-bit comparator.

The loop filter 306 has differential voltage outputs $V_i^+$ and $V_i^-$. These differential voltage signals are converted to differential current signals with a source-degenerated transconductance (Gm) stage 307. The Gm cell is implemented as a source degenerated PMOS transconductance amplifier, which is composed of current sources $I_s$ 406, source-degeneration resistor Rs 408, a capacitor $C_s$ 410, and thin-oxide PMOS transistors $M_1$, $M_2$ 412. Source degeneration is employed to improve the linearity of the Gm cell for a large input swing of ±250 mV. Capacitor Cs is added at the source of $M_1$, $M_2$ 412 to generate a zero in the transfer function of the Gm stage 307 (V/I converter), and to compensate its phase shift/delay. The current source $I_s$ can be for example implemented as cascaded PMOS current source.

The bandwidth of the Gm cell affects the stability of the outer FB loop, but not the fast FB loop. The ELD DAC 318 is implemented as a current steering DAC. NMOS switches $M_3$, $M_4$ 420 and the current source $I_{dac,u}$ 422 compose a unit ELD DAC. NMOS transistors $M_5$, $M_6$ 430 and the current source $I_{ref,u}$ construct a reference current unit 340. For (n+1)-level quantization, 'n' reference levels need to be created, and thus (n-1) reference current units are required for every slice. The complementary Sp[1]/Sn[1]–Sp[n-1]/Sn[n-1] can be configured to either Vdd (1.1 V) or ground, which define the reference level of the slice. Among different slices, the proposed reference current circuits have the same common-mode current, and only their differential current is different. This property ensures that the circuits in different slices are working in the same common-mode condition. After the latch block, a transmission gate ($M_7$, $M_8$ 442) with complementary sampling clocks ($clkp_{SH}$ 449 and $clkn_{SH}$ 448) is employed to sample the latch output at the end of the latch 336. Two buffers 404 are inserted between the sampled latch output and the input of the ELD DACs. The choice of a number of buffers is a trade-off between minimizing the load capacitance of the latch, and reducing the delay of the buffers. The 1st buffer ($M_9$, $M_{10}$ 444) is a NMOS buffer with PMOS load, while the 2nd buffer ($M_{11}$, $M_{12}$ 446) is a CMOS buffer. The NMOS buffer has lower input capacitance than the CMOS buffer, but it consumes more power. The CMOS buffer offers rail-to-rail driving ability. For the (n+1)-level quantization, one sampled latch output node should drive 'n' unit ELD DACs after two buffers.

The reference current is designed to have the same common-mode current for every slice, i.e. $I_{refp,1}+I_{refn,1}=I_{refp,2}+I_{refn,2}=\ldots=I_{refpn}+I_{refn,n}$. The differential reference current signal $I_{refp,m}-I_{refn,m}$ is different for every slice. The source-degenerated Gm stages, the connection circuit, the latches, and the samplers are exactly the same for these 'n' slices.

The $m^{th}$ ELD DAC is an (n+1)-level current steering DAC. The ELD DACs are implemented similarly as the reference current, but their switches are controlled by the digital output of the (n+1)-level comparator. The current sources in the reference current and ELD DACs can be for example implemented as cascaded NMOS current sources.

Figure 5:
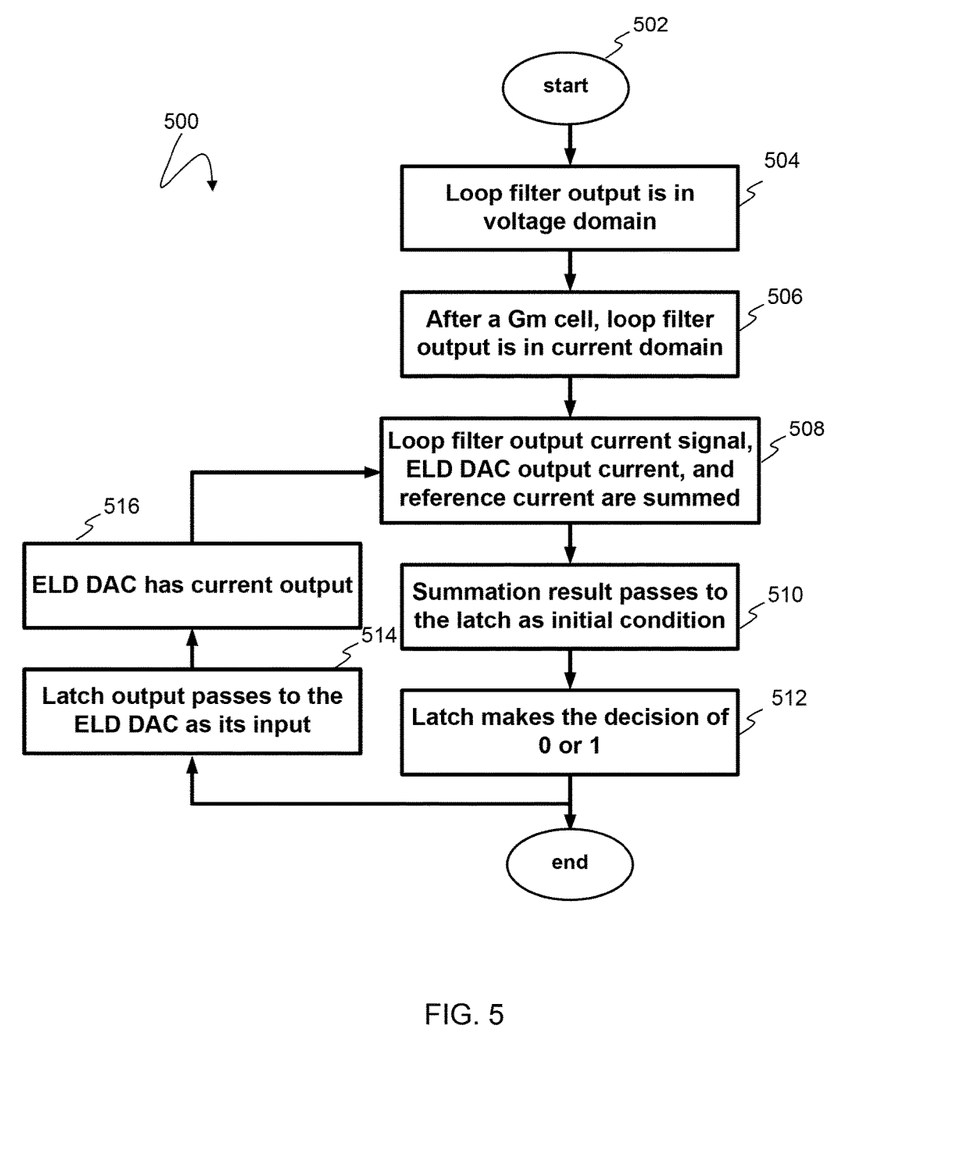
FIG. 5 illustrates an example flow chart of a SDM system with multi-bit quantization and ELD compensation, according to some examples of the invention.

FIG. 5 illustrates an example flowchart 500 of a SDM system with multi-bit quantization and ELD compensation, according to some examples of the invention. The flowchart 500 starts at 502 and at 504 the loop filter output is in a voltage domain, in accordance with known continuous-time ADCs. At 506, after the loop filter output is fed through one or more transconductance amplifiers (Gm cells), the loop filter output is in a current domain. At 508, a combination of the loop filter output current signal, an ELD DAC output current and a reference current are summed, in each of one or a plurality of paths. At 510, the summation result is passed to a latch as an initial condition. At 512, the latch makes a decision to output a '0' or a '1', based on the respective summation.

A feedback loop exists, whereby at 514 the latch output is also passed to the respective ELD DAC as its input. At 516, the respective ELD DAC has a current output, which feeds into the aforementioned summation step at 508.

It is envisaged that in other examples, alternative circuits and components may be employed that utilise the concepts herein before described. For example, it is envisaged that different types of DAC architecture may be employed as the design is not limited to use of current-steering DACs. Furthermore, in other examples, the loop filter may take different forms, e.g. a feedback filter or feedforward filter.

In some examples, a single feedback path may be used. In other examples, as illustrated, multiple paths to multiple separate ELD DACs may be used. In this manner, a use of multiple paths to multiple separate ELD DACs may be employed to optimise the circuit for best timing.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above. The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed. Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality. Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments. Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner. Also for example, the examples, or portions thereof, may implemented as soft or code representations of physical circuitry or of logical representations convertible into physical circuitry, such as in a hardware description language of any appropriate type. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A multi-bit continuous-time sigma-delta modulator (SDM), comprising:
    an input configured to receive an input analog signal;
    a first summing junction configured to subtract a feedback analog signal from the input analog signal and produce an analog output signal;
    a loop filter configured to filter the analog output signal from the first summing junction;
    an analog-to-digital converter (ADC) configured to convert the filtered analog output signal to a digital output signal, wherein the ADC comprises multiple per-bit parallel loops having a plurality of paths, each path comprising a respective latch coupled to an output of a current summing junction and configured to provide a one-bit contribution to the digital output signal, each loop configured to provide a per-bit current summation of the filtered analog output signal using static reference currents directly to an input of the respective latch such that an output of the multiple per-bit parallel loops is a multi-bit quantization digital output signal; and
    a feedback path comprising a main digital-to-analog converter (DAC) configured to convert the digital output signal to the feedback analog signal and route the feedback analog signal to the first summing junction.

2. The multi-bit continuous-time SDM of claim 1, wherein the current summing junction is configured to sum each of a current domain representation of the filtered analog output signal, a current domain bit representation of the multi-bit quantization digital output signal from an excess loop delay (ELD) DAC, and a respective static reference current for each path.

3. The multi-bit continuous-time SDM of claim 1, wherein each path further comprises:
    a voltage-to-current converter configured to receive the filtered analog output signal in a voltage domain and convert the filtered analog output signal into a current domain; and
    an excess loop delay (ELD) DAC configured to convert one bit of the multi-bit quantization digital output signal to an analog form.

4. The multi-bit continuous-time SDM of claim 3, wherein the ELD DAC is configured to convert one bit of the digital output signal to an analog form.

5. The multi-bit continuous-time SDM of claim 1, wherein the plurality of paths comprise a plurality of quantizer paths, with each path comprising a transconductance amplifier as a voltage-to-current converter.

6. An integrated circuit comprising a multi-bit continuous-time sigma-delta modulator (SDM), comprising:
    an input configured to receive an input analog signal;
    a first summing junction configured to subtract a feedback analog signal from the input analog signal and produce an analog output signal;
    a loop filter configured to filter the analog output signal from the first summing junction;
    an analog-to-digital converter (ADC) configured to convert the filtered analog output signal to a digital output signal, wherein the ADC comprises multiple per-bit parallel loops having a plurality of paths, each path comprising a respective latch coupled to an output of a current summing junction and configured to provide a one-bit contribution to the digital output signal, each loop configured to provide a per-bit current summation of the filtered analog output signal applying static reference currents directly to an input of the respective latch such that an output of the multiple per-bit parallel loops is a multi-bit quantization digital output signal; and
    a feedback path comprising a main digital-to-analog converter (DAC) configured to convert the digital output signal to the feedback analog signal and route the feedback analog signal to the first summing junction.

7. A method for generating a multi-bit quantization digital output signal by a multi-bit continuous-time sigma-delta modulator (SDM), the method comprising:
    receiving an input analog signal;
    subtracting a feedback analog signal from the input analog signal in a first summing junction to produce an analog output signal;
    filtering the analog output signal from the first summing junction;
    converting the filtered analog output signal to a digital output signal in an analog-to-digital converter (ADC) by providing a per-bit current summation of the filtered analog output signal that is a multi-bit quantization digital output signal using multiple per-bit parallel loops and static reference currents in the ADC, wherein the ADC comprises multiple per-bit parallel loops comprising a plurality of paths, each path comprising a respective latch coupled to an output of a current summing junction and configured to provide a one-bit contribution to the digital output signal by applying static reference currents directly to an input of the respective latch;
    converting the digital output signal, via a main digital-to-analog converter (DAC), to the feedback analog signal and routing the feedback analog signal to the first summing junction.

8. The method of claim 7, wherein converting the filtered analog output signal to the digital signal in each path further comprises:
    converting the filtered analog output signal to a current domain;
    converting one bit of the multi-bit quantization digital output signal to an analog form by an excess loop delay (ELD) DAC; and
    summing each of a current domain representation of the filtered analog output signal, a current domain bit representation of the multi-bit quantization digital output signal from the ELD DAC, and a dedicated reference current for each path.

9. The multi-bit continuous-time SDM of claim 2, wherein the ELD DAC is a differential DAC.

10. The multi-bit continuous-time SDM of claim 9, wherein the differential DAC is configured to provide a dynamic differential current.

* * * * *